United States Patent
Inoue et al.

(10) Patent No.: US 6,783,654 B2
(45) Date of Patent: Aug. 31, 2004

(54) ELECTROLYTIC PLATING METHOD AND DEVICE FOR A WIRING BOARD

(75) Inventors: Toshiki Inoue, Aichi-ken (JP); Kyoko Kumagai, Aichi-ken (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 85 days.

(21) Appl. No.: 09/805,841

(22) Filed: Mar. 14, 2001

(65) Prior Publication Data

US 2001/0023830 A1 Sep. 27, 2001

(30) Foreign Application Priority Data

Mar. 22, 2000 (JP) ........................................ 2000-079709

(51) Int. Cl.[7] .............................................. C25D 3/38
(52) U.S. Cl. .................... 205/292; 205/103; 205/291; 205/239; 205/270; 205/125; 205/148; 204/DIG. 9
(58) Field of Search ................................ 205/103, 291, 205/292, 239, 270, 125, 148; 204/242, 293, DIG. 9, 284

(56) References Cited

U.S. PATENT DOCUMENTS

| 4,292,144 A | * | 9/1981 | Lepetit et al. | ............... | 205/103 |
| 5,683,564 A | * | 11/1997 | Reynolds | ..................... | 205/68 |
| 5,976,341 A | * | 11/1999 | Schumacher et al. | ........ | 205/101 |
| 6,099,711 A | * | 8/2000 | Dahms et al. | ............... | 205/101 |
| 6,129,830 A | * | 10/2000 | Senge et al. | ................. | 205/104 |
| 6,537,439 B2 | * | 3/2003 | Hauptmann et al. | ........ | 205/574 |

FOREIGN PATENT DOCUMENTS

| JP | A-8-507106 | 7/1996 |
| JP | A-11-8469 | 1/1999 |

OTHER PUBLICATIONS

Copy of the Official Letter of Aug. 4, 2003 with English Translation. German Patents DE 195 45 231 A1 and DE 43 44 387 C2 mentioned in Official Letter have English Equivalents 5,976,341 and 6,099,711 which were cited in U.S. 1st Official Action mailed Nov. 5, 2002.

* cited by examiner

Primary Examiner—Wesley A. Nicolas
(74) Attorney, Agent, or Firm—Woodcock Washburn LLP

(57) ABSTRACT

A plating bath which accommodates an insoluble anode and a printed-circuit board, and a copper dissolved bath which supplies copper ions are arranged. The insoluble anode is arranged as opposed to the printed-circuit board being a cathode, and a forward/reverse current is applied between both of the electrodes. Iron ions are added to a plating solution.

6 Claims, 8 Drawing Sheets

(CATHODE REACTION)  $Cu^{2+} + 2e \longrightarrow Cu$ (COPPER DEPOSIT)
$Fe^{3+} + e \longrightarrow Fe^{2+}$ (ANODE REACTION)  $Fe^{2+} \longrightarrow Fe^{3+} + e$
$2H_2O \longrightarrow O^{2-} + 4H^+ + 2e$ (COPPER DISSOLUTION REACTION)  $Cu + Fe^{3+} \longrightarrow Cu^{2+} + Fe^{2+}$

| SAMPLE | PLATING SOLUTION | AVERAGE CURRENT DENSITY | TIME |
|---|---|---|---|
| 1 | NO Fe IONS | 3 A/dm$^2$ | 33.3 MINUTES |
| 2 | Fe$^{2+}$ 15g/L | 3 A/dm$^2$ | 33.3 MINUTES |
| 3 | Fe$^{2+}$ 0.1g/L | 3 A/dm$^2$ | 33.3 MINUTES |

FIG. 5

| SAMPLE | Fe(gh) | Rz($\mu$m) | | Av. ($\mu$m) |
|---|---|---|---|---|
| 1 | 0 | 3.334 | 3.663 | 3.496 |
| 2 | 15 | 1.949 | 1.694 | 1.821 |
| 3 | 0.1 | 2.884 | 2.776 | 2.830 |

F I G. 6

ELECTROLYTIC PLATING METHOD AND DEVICE FOR A WIRING BOARD

BACKGROUND OF THE INVENTION

1. Field of the Invention

The present invention relates to an electrolytic plating method and device filling up a microvia hole formed on a wiring board with metal plating.

2. Description of the Related Art

For electric appliances such as a cellular phone, a video camera, a notebook computer, etc., it is demanded to mount high-density components. As an implementation of high-density mounting, a buildup board on which a wiring layer and an insulation layer are sequentially formed, a printed-circuit board of an all-layer microvia type to which wiring boards on which microvias are formed are attached with heat and pressure, etc. are proposed.

For a conventional buildup board, micro holes (microvia holes) are formed on an insulation layer, and the inner side and the bottom of the holes are metal-plated, so that wiring layers above and below the insulation layer are electrically connected.

With this method, however, it is difficult to further form one microvia hole on another, and to securely connect the holes in an electric manner. Therefore, a land cannot be arranged on a microvia hole after microvia holes are stacked. Due to such a restriction on a pattern design, the whole of a pattern design cannot be made with an automatic wiring tool, and part of the design must be made manually. As a result, the time period required to design a printed-circuit board becomes long.

To overcome such a problem, a technique filling up microvia holes with electrolytic plating is proposed. For example, Japanese Laid-open Patent Publication Heisei 11, No. 8469 discloses the technique of filling up microvia holes by performing electric metal plating with PR electrolysis after an electroless metal film is formed.

However, with the plating method using PR electrolysis disclosed by the above described publication, plating must be performed for a long time (for example, two hours or longer) to fill up microvia holes. Therefore, the manufacturing cost of a printed-circuit board increases, and it is difficult to use a printed-circuit board on a mass-production level. Additionally, attempts are made to improve the density of an electric current in order to shorten a plating time. However, problems such that a void occurs during plating, or a plated surface becomes rough occur.

Furthermore, to solve the problems occurring when a soluble anode is used, for example, Japanese Laid-open Patent Publication Heisei 8, No. 507106 discloses a metal plating method using an insoluble anode and a plating solution to which an oxidation-reduction compound is added The above described invention assumes electrolytic plating using a direct current power source, and does not present a plating method for filling up microvia holes on a printed-circuit board for a short time.

SUMMARY OF THE INVENTION

An object of the present invention aims at filling up microvia holes on a printed-circuit board for a short time.

According to the present invention, a printed-circuit board is used as one pole and an insoluble electrode is used as the other, and electrolytic plating is performed by applying a forward/reverse current with the use of a metal plating solution including iron ions by 0.1 gram/liter or more, so that microvia holes formed on a printed-circuit board are filled up with metal plating.

According to the present invention, electrolytic plating is performed by applying a forward/reverse current with the use of a metal plating solution including iron ions by 0.1 gram/liter or more, whereby microvia holes can be filled up for a time shorter than a conventional method, and a metal film having a smooth surface characteristic can be formed. As a result, microvias which electrically connect wiring layers above and below an insulation layer can be formed for a short time, thereby significantly reducing the manufacturing cost of a multi-layer printed-circuit board.

As an electrolytic plating method, for example, a pulse reverse electrolytic method applying a forward/reverse pulsed current is available.

Additionally, a plating solution may be stirred to flow in parallel with the surface to be plated of a printed-circuit board. At this time, the flow quantity of the plating solution may be controlled depending on the diameter or the depth of a microvia hole.

With the above described configuration, the deposit speed of metal plating on the surface of a printed-circuit board and that of metal plating within a microvia hole can be suitably controlled. Consequently, a deep microvia hole with a short diameter can be filled up without causing a void, etc. within the hole.

BRIEF DESCRIPTION OF THE DRAWINGS

FIG. 5 shows the plating conditions of Samples;

FIG. 6 shows the results of measuring the degree of roughness of surfaces in Samples;

DESCRIPTION OF THE PREFERRED EMBODIMENTS

Figure 1:
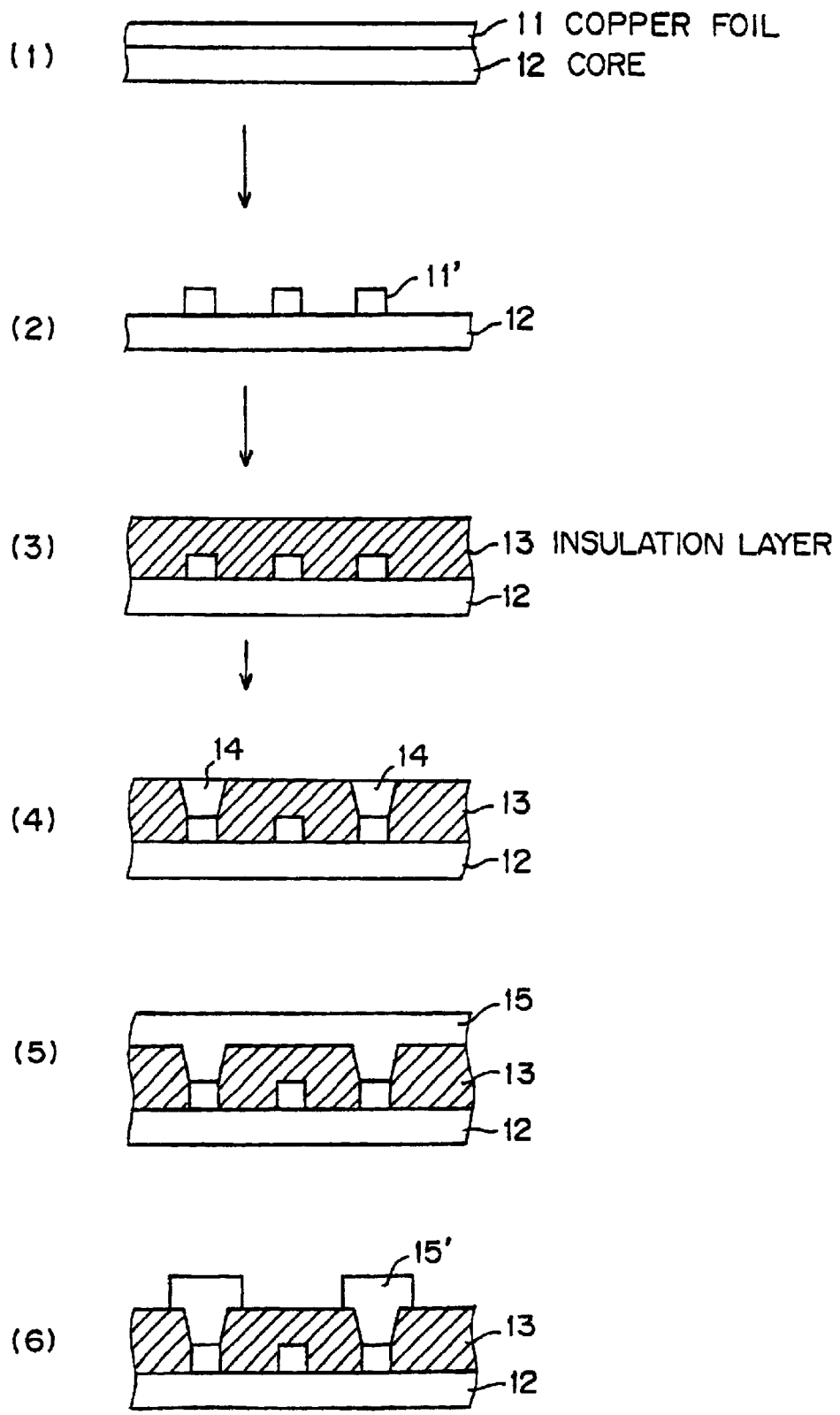
FIG. 1 explains the manufacturing process of a multi-layer printed-circuit board.

Hereinafter, a preferred embodiment according to the present invention will be described by referencing drawings. First of all, the manufacturing process of a multi-layer printed-circuit board is explained by referencing FIG. 1.

A wiring pattern (wiring layer) 11' is formed by etching a copper foil (conductor layer) stacked onto a core resin 12 such as glass epoxy, etc. (process steps (1) and (2) in FIG. 1). Next, an insulation layer 13 is formed on the wiring pattern (process step (3) in FIG. 1). Holes are drilled in the insulation layer 13 with laser, etc., so that microvia holes 14 are formed (process step (4) in FIG. 1). Next, a copper plated layer 15 is formed with electrolytic plating, etc. to fill up the microvia holes (process step (5) in FIG. 1). In the plating process step (5) in FIG. 1, after a thin conductor layer is formed with chemical plating, etc. on the wiring pattern 11' at the bottom of the insulation layer 13 and the microvia holes 14, the microvia holes 14 are filled up with pulse reverse electrolytic plating to form the copper plated layer 15. Then, a wiring pattern 15' is formed by etching the copper plated layer 15 (process step (6) in FIG. 1). As a result, the wiring patterns 11' and 15' above and below the insulation layer 13 can be electrically connected.

The technique filling up microvia holes with pulse reverse electrolytic plating is recited, for example, in "Gist of the 100th Lecture" (held on Oct. 6 and 7, 1999) by Surface Finishing Society of Japan.

Next, an electrolytic plating method for a printed-circuit board according to this preferred embodiment will be explained by referencing FIG. 2.

A plating bath 21 is composed of insoluble anodes 22, a cathode 23 being a printed-circuit board, a power source 24 for applying a forward/reverse current between the electrodes, and a copper plating solution including iron ions. To widen the surface areas of the electrodes, a multi-aperture electrode such as an expanded metal, etc. is used as each of the insoluble anodes 22.

Besides, copper dissolved baths 25 are arranged to supply copper ions to the plating bath 21, and a solution within the copper dissolved baths 25 and the plating solution within the plating bath 21 are circulated by a circulation pump 26.

Figure 2:
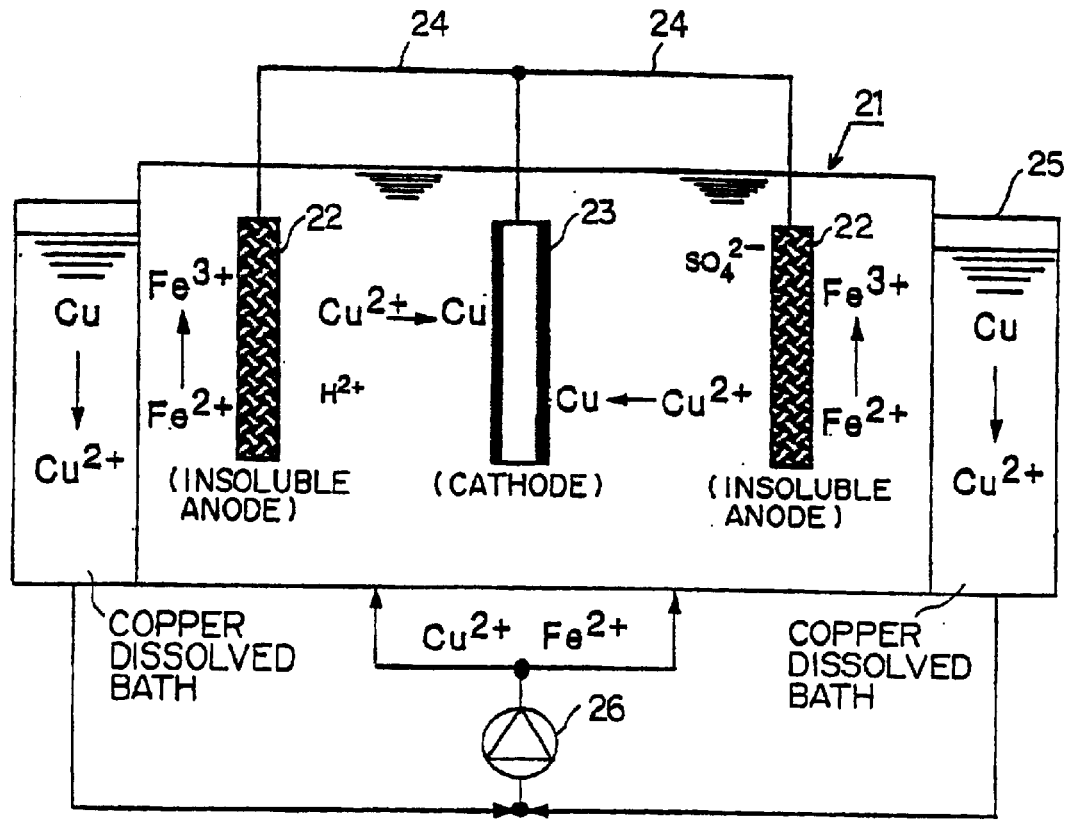
FIG. 2 explains an electrolytic plating method according to a preferred embodiment.

According to this preferred embodiment, an iron ion "$Fe^{2+}$" is added to the plating solution, so that "$Fe^{3+}+e$" is generated from "$Fe^{2+}$" in the proximity of the insoluble anodes 22 as shown in FIG. 2.

In the copper dissolved baths 25, "$Cu^{2+}$" and "$Fe^{2+}$" are generated by the dissolution reaction between the copper material within the copper dissolved baths 25 and "$Fe^{3+}$" which is generated by each of the insoluble anodes 22 and carried to the copper dissolved baths 25.

At the cathode 23, Cu is deposited from "$Cu^{2+}$" which is carried from the copper dissolved baths 25, so that a copper plated layer is formed on the printed-circuit board. At the same time, "$Fe^{2+}$" is produced from "$Fe^{3+}+e$" which is generated by the insoluble anodes 22.

Namely, "$Fe^{3+}$" is generated from the iron ion "$Fe^{2+}$" included in the plating solution as a result of the electrolytic reaction of the insoluble anodes 22, and "$Cu^{2+}$" and "$Fe^{2+}$" are generated by "$Fe^{3+}$" and the copper material within the copper dissolved baths 25. Therefore, the copper ion "$Cu^{2+}$" and the iron ion "$Fe^{2+}$" which is added to the plating solution and consumed by the reaction of the insoluble anodes 22 continue to be supplied from the copper dissolved baths 25.

Figure 3:
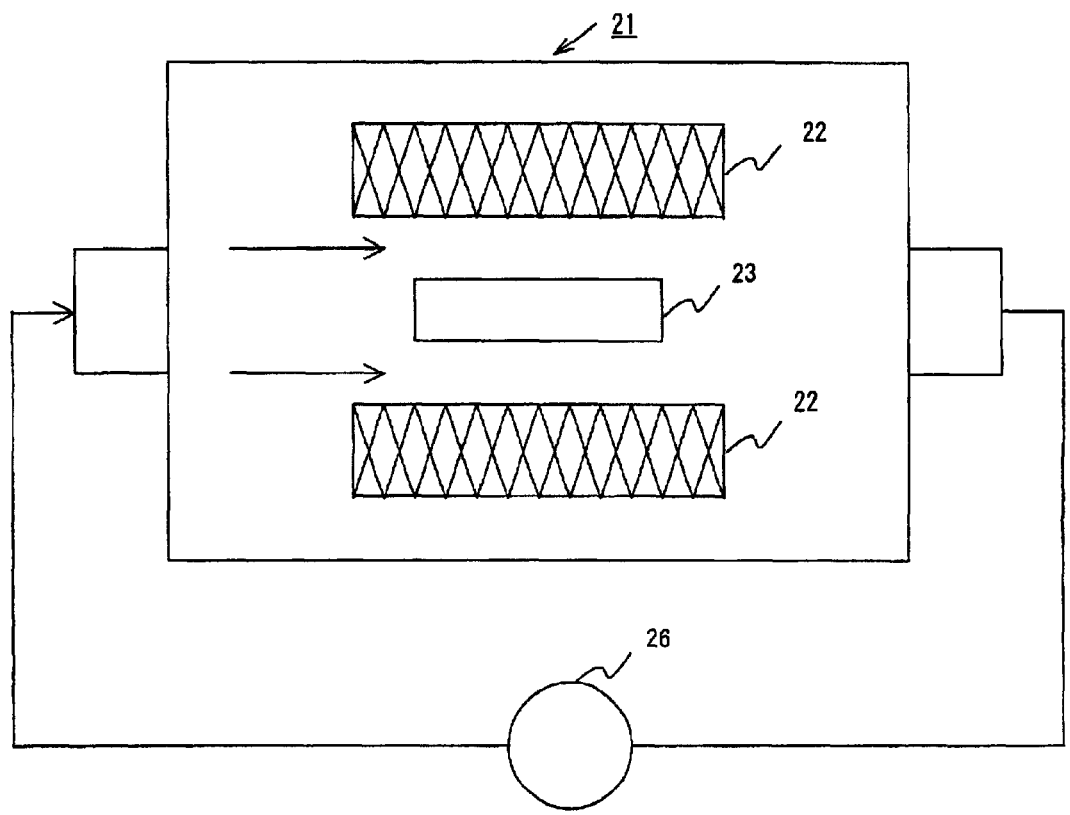
FIG. 3 shows the flow of a plating solution.

FIG. 3 schematically shows the flow of the plating solution within the plating bath 21 according to this preferred embodiment.

The cathode (printed-circuit board) 23 is arranged in the middle of the plating bath 21, and the two insoluble anodes 22 in a meshed state are arranged as opposed to the printed-circuit board 23. The plating solution is circulated by the circulation pump 26 in the right direction of FIG. 3. That is, the plating solution is circulated to flow in parallel to the surface to be plated by a predetermined flow quantity. By making the plating solution flow in parallel to the surface to be plated of the printed-circuit board 23, microvia holes are completely filled up, and a plated layer having a suitable film thickness can be formed. This can be considered to be implemented, because the deposit speed of copper on the surface of the printed-circuit board 23 and that of copper within the microvia holes can be adjusted by making the plating solution flow, for example, in parallel to the surface of the printed-circuit board 23 to control the amount of "Fe3+" existing on the surface of the printed-circuit board 23.

Described next are plating conditions and evaluation results of plating when a microvia hole having a depth of 50 μm, which is formed on an insulation layer, is filled up with the plating method according to this preferred embodiment.

The fundamental composition of the plating solution used in this preferred embodiment is as follows:
  copper sulfate•5 hydrates: 235.7 g/liter (L)
  sulfuric acid: 60 g/L
  organic additive (surface active agent such as Impulse Leveler provided by Atotec Co., Ltd.)
  organic additive (brightener such as Impulse Brightener provided by Atotec Co., Ltd.)
  chloric ion: 40 mg/L
  iron ion: 15 g/L (or 0.1 g/L)

Figure 4:
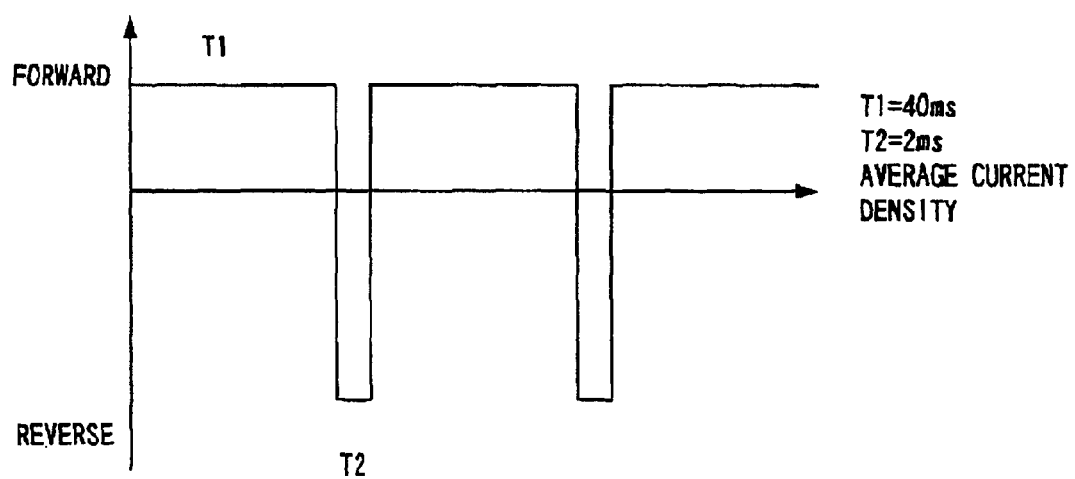
FIG. 4 shows the waveform of a plating current.

In this preferred embodiment, pulse reverse electrolytic plating is performed by applying a forward/reverse pulsed current to the electrodes. The plating current applied to both of the electrodes is a forward/reverse pulsed current having a forward current duration T1 that is 40 ms, and a reverse current duration T2 that is 2 ms, as shown in FIG. 4. Furthermore, the average current density of the cathode is set to 3A/dm$^2$.

FIG. 5 shows the plating conditions of Samples 1 through 3 of a printed-circuit board for which pulse reverse electrolytic plating is performed, namely, the amount of iron ions included in the plating solution, the average current density, a plating time, and the thickness of a plated layer.

Sample 1 indicates the plating performed for 33.3 minutes with the average current density 3A/dm$^2$ in a plating solution that does not include iron ions.

Sample 2 indicates the plating performed for 33.3 minutes with the average current density 3A/dm$^2$ in a plating solution that includes iron ions by 15 g/L.

Sample 3 indicates the plating performed for 33.3 minutes with the average current density 3A/dm$^2$ in a plating solution that includes iron ions by 0.1 g/L.

FIG. 6 shows the results of the measurement of the degrees of roughness of the plated surfaces of Samples 1 through 3 by using a roughness meter of a touch needle type.

In this figure, the average value of the degree of roughness of the plated surface of Sample 1, for which the pulse reverse electrolytic plating is performed for 33.3 minutes with the plating solution that does not include iron ions, is 3.496 μm, whereas the average value of the degree of roughness of the plated surface of Sample 3, for which the pulse reverse electrolytic plating is performed for 33.3 minutes with the plating solution that includes iron ions by 0.1 g/L, is 2.830 μm. Namely, it can be verified that a smoother plated surface can be obtained by Sample 3 for which the plating is performed with the plating solution including iron ions.

Additionally, the average value of the degree of roughness of the plated surface of Sample 2, for which the pulse reverse electrolytic plating is performed for 33.3 minutes with the plating solution that includes iron ions by 15 g/L is 1.821 μm, and a further smoother plated surface than that with the plating solution which includes iron ions by 0.1 g/L can be obtained.

Figure 7A:
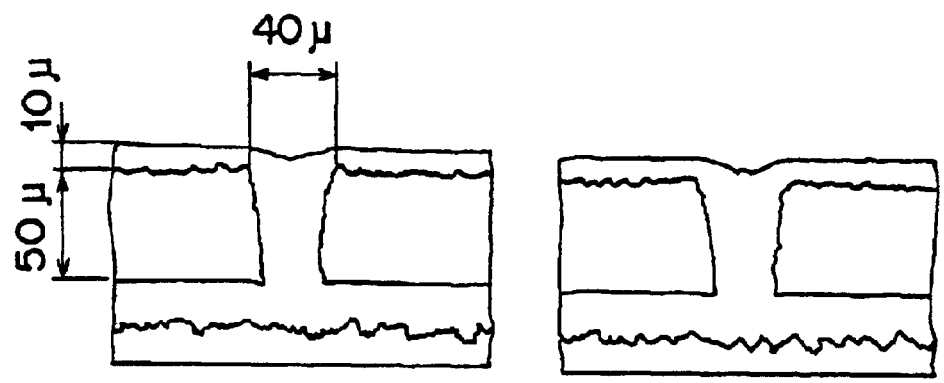
FIGS. 7A and 7B show the cross-sectional view of a microvia according to the preferred embodiment.
Figure 7B:
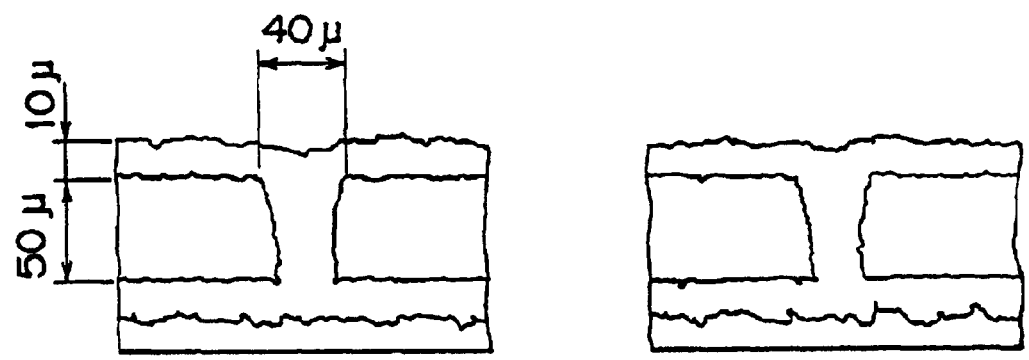

FIG. 7A shows the cross-sectional view of a microvia when the pulse reverse electrolytic plating is performed with the plating solution which includes iron ions by 15 g/L under the above described conditions. In the meantime, FIG. 7B shows the cross-sectional view of a microvia when the pulse reverse electrolytic plating is performed by using the plating solution which includes iron ions by 0.1 g/L.

Figure 8:
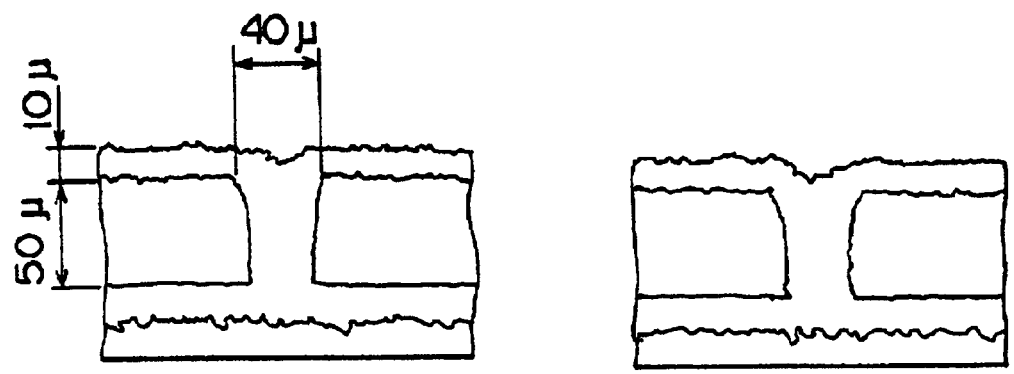
FIG. 8 shows the cross-sectional view of a microvia when being plated with a plating solution that does not include iron ions.

Furthermore, FIG. 8 shows the cross-sectional view of a microvia when the pulse reverse electrolytic plating is performed with the plating solution which does not include iron ions.

Note that a microvia hole tapers, the diameter of the aperture of the hole is 40 μm, the diameter of the bottom of the hole is 25 μm, and the depth is 50 μm.

If the pulse reverse electrolytic plating is performed for 33.3 minutes with the plating solution which includes iron ions by 15 g/L, the microvia hole is completely filled up, and the copper plated surface is smooth as shown in FIG. 7A. Since a cavity in the middle of the microvia is smaller in comparison with its depth (50 μm), it does not matter practically.

If the pulse reverse electrolytic plating is performed for 33.3 minutes with the plating solution which includes iron ions by 0.1 g/L, the microvia hole is completely filled up a shown in FIG. 7B. Although the copper plated surface is slightly rougher than that in FIG. 7A, it is a level which does not matter practically.

FIG. 8 shows the cross-sectional view of a microvia hole when the pulse reverse electrolytic plating is performed with the plating solution which does not include iron ions under the above described conditions for comparison. In this case, the microvia is filled up, but the copper plated surface becomes rougher in comparison with the case where the plating is performed with the plating solution which includes iron ions by 0.1 g/L in FIG. 7B. If a plated surface is rough, a pattern on the lower surface of a resist is scraped when the resist is formed to etch the pattern, leading to an unevenness of the width of the pattern. Therefore, it can be verified that a wiring pattern of higher quality can be obtained with the plating solution which includes iron ions in FIG. 7A or 7B.

It can be verified from the results of the comparisons between the degrees of roughness of the plated surface and the cross-sectional views of the microvias in FIGS. 7A, 7B, and 8 that microvias can be filled up for a time (approximately 33.3 minutes) shorter than a conventional method by adding iron ions to a plating solution by 0.1 g/L or more, and by performing pulse reverse electrolytic plating, and at the same time, a plated surface can be formed to be smooth Furthermore, judging from the result in the case where the plating is performed with the plating solution which does not include iron ions under the same conditions, it can be verified that an effect of smoothing a plated surface by adding iron ions is high.

According to the above described preferred embodiment, iron ions are added to a copper dissolved solution and pulse reverse electrolytic plating is performed, whereby microvia holes can be filed up for a short time, and its surface can be almost smoothed.

Additionally, a plating solution is made to flow in parallel to the surface to be plated (the surface on which microvia holes are formed) of a printed-circuit board being a cathode, thereby further improving the plating characteristic. Furthermore, by controlling the flow quantity of a plating solution to be a suitable value, the deposit speed of the surface of the cathode 23 and that of copper within a microvia hole my be set to a desired value.

In the above described preferred embodiment, "$Fe^{2+}$" is added to a copper plating solution. However, the present invention is not limited to "$Fe^{2+}$", and other oxidization-reduction compounds may be added. The present invention may also be applied to metal plating other than copper. Furthermore, the application time of a forward/reverse plating current, the current density of an electrode, the composition of a plating solution, a plating time, etc. are not limited to those implemented in the above described preferred embodiment. For example, any composition can be used if it is available to electrolytic plating of copper, and other metals.

Still further, the direction in which a plating solution is made to flow upward or downward, not limited to the right and the left. The essentiality is to make a plating solution flow in parallel to the surface desired to be plated of a printed-circuit board. The present invention may be applied to a multi-layer substrate on which a semiconductor device is mounted, etc., not limited to a multi-layer printed circuit board.

According to the present invention, microvia holes are filled up for a short time, and a metal film having a smooth surface characteristic can be formed. Namely, microvias which electrically connect wiring layers above and below an insulation layer can be formed for a short time, thereby significantly reducing the manufacturing cost of a multi-layer wiring board.

What is claimed is:

1. An electrolytic plating method, comprising:

using a wiring board, wherein a surface of the wiring board having formed thereon microvia holes having a copper foil at the bottom of each microvia hole, as one pole, and an insoluble electrode as the other pole;

stirring a metal plating solution which contains iron ions of at least 0.1 gram/liter so as to make the solution flow in parallel to a surface to be plated of the wiring board; and performing electrolytic plating by applying a forward/reverse current with the use of a metal plating solution so that the microvia holes having the copper foil at the bottom formed on the surface of the wiring board may be filled up with metal plating.

2. The electrolytic plating method according to claim 1, wherein:

the metal plating solution is composed of copper plating solution; and the flow rate of the copper plating solution is adjusted to a level at which copper deposition speeds both on the surface and inside microvia holes of the wiring board are optimum.

3. The electrolytic plating method according to claim 2, wherein the flow rate of the copper plating solution is adjusted to bring the iron ion amount present near the wiring board surface to a level at which all the microvia holes are almost fully filled and the plating layer thickness on the wiring board surface becomes optimum.

4. The electrolytic plating method according to claim 1, wherein:

the insoluble electrode is configured by a multi-aperture metal mesh.

5. The electrolytic plating method according to claim 1, wherein:

the metal plating solution is a copper plating solution; and the wiring board is a printed-circuit board.

6. The electrolytic plating method according to claim 1, further comprising:

arranging a plating bath which accommodates the insoluble electrode and the wiring board, and a copper dissolved bath which supplies copper ions to said plating bath; and circulating a solution within the copper dissolved bath and the plating solution within the plating bath.

* * * * *